US007288976B2

(12) United States Patent
Lee et al.

(10) Patent No.: US 7,288,976 B2

(45) Date of Patent: Oct. 30, 2007

(54) CHARGE PUMP CIRCUIT AND METHOD THEREOF

(75) Inventors: Chao-Cheng Lee, Hsin-Chu (TW); Ren-Chieh Liu, Chang-Hua Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/278,145

(22) Filed: Mar. 31, 2006

(65) Prior Publication Data

US 2007/0229130 A1 Oct. 4, 2007

(51) Int. Cl.
*H03L 7/06* (2006.01)

(52) U.S. Cl. .................................................... 327/157

(58) Field of Classification Search ................ 327/147, 327/148, 150, 156, 157, 159, 536
See application file for complete search history.

(56) References Cited

U.S. PATENT DOCUMENTS 6,118,346 A 9/2000 Olgaard
6,262,610 B1 * 7/2001 Lo et al. .................... 327/157
6,326,852 B1 12/2001 Wakayama
6,566,920 B1 * 5/2003 Kim .......................... 327/147
6,593,817 B1 * 7/2003 Magazz' et al. ............. 331/17
7,016,450 B2 * 3/2006 Lin et al. ................... 375/374
7,019,571 B2 * 3/2006 Lim .......................... 327/157
2002/0050864 A1 5/2002 Wakayama
2006/0033554 A1 2/2006 Matsunami

FOREIGN PATENT DOCUMENTS

GB 2 384 123 A 7/2003

OTHER PUBLICATIONS

Marco Cassia, Peter Shah, Brik Druun, "Analytical Model and Behavioral Simulation Approach for a ΣΔ Fractional-N Synthesizer Employing a Sample-Hold Element", IEEE Transactions on Circuits and Systems-II. Analog and Digital Signal Processing, Nov. 2003, pp. 850-859, vol. 50, No. 11, IEEE.

* cited by examiner

*Primary Examiner*—Jeffrey Zweizig
(74) *Attorney, Agent, or Firm*—Winston Hsu

(57) ABSTRACT

A charge pump circuit capable of canceling current mismatch and suppressing clock feedthrough. The charge pump circuit comprises a current source enabled by a first logical signal, a current sink enabled by a second logical signal, an integrating capacitor coupled to both the current source and the current sink, and a switching device coupled between the integrating circuit and an output node. The switching device has two states. The switching device is set to a first state whenever a third logical signal is asserted and one of the first logical signal, the second logical signal, and a modulating signal is enabled. The switching device is set to a second state whenever the third logical signal is de-asserted, or none of the first logical signal, the second logical signal, and the modulating signal are asserted.

22 Claims, 3 Drawing Sheets

CHARGE PUMP CIRCUIT AND METHOD THEREOF

BACKGROUND OF THE INVENTION

1. Field of the Invention

The prevent invention relates to charge pump circuit, more particularly, to method and apparatus for canceling mismatch and suppressing clock feedthrough for charge pump circuit.

2. Description of Related Art

A typical PLL (phase lock loop) comprises a PFD (phase/frequency detector), a charge pump circuit, a loop filter, and a VCO (voltage controlled oscillator). The PFD compares the phase of a reference clock with that of the output clock of the VCO. Usually two logical signals, said UP and DN signals are used by the PFD to represent the phase difference between the two clocks. Each time a phase comparison is made, an UP pulse and a DN pulse are generated. If the reference clock is leading the VCO output clock (in clock phase), the UP pulse is longer than the DN pulse. Otherwise, the DN pulse is longer than the UP pulse. The two logical signals are converted into a current signal using the charge pump circuit. FIG. 1 schematically depicts a prior art charge pump circuit. Throughout this disclosure, VDD denotes a supply voltage. The charge pump circuit comprises a current source 110 of magnitude I, a switch 120 controlled by the UP signal, a current sink 130 of magnitude I, and a switch 140 controlled by the DN signal. When UP is 1 and DN is 0, the output current IOUT is positive (i.e. out-flowing). When UP is 0 and DN is 1, the output current IOUT is negative (i.e. in-flowing). When UP is 0 and DN is 0, the output current IOUT is zero. The output of the charge pump is coupled to the loop filter, which typically comprises a resistor in series with a capacitor to convert the output current from the charge pump into a voltage, which is used to control the VCO.

In practice, however, the prior art charge pump circuits shown in FIG. 1 are prone to problems due to circuit non-idealities. First, the magnitude of the current source 110 may not be exactly the same as that of the current sink 130 due to variation within the manufacturing process. Second, the switching activities of switch 120 and 140 will induce noises such as feedthrough and charge injection, resulting in voltage ripple on node IOUT. These non-idealities will lead to performance degradation to the PLL. To be specific, they lead to clock jitters in a periodic fashion, which in frequency domain appear as a plurality of spurious spectral components. In particular, the strongest spurious spectral component, known as the reference spur, appears at a frequency location that is exactly the same as the reference clock frequency.

The conventional method disclosed by Wakayama (in U.S. Pat. No. 6,326,852) has a few drawbacks. First, the circuit complexity is high. Second, the offset voltage of the operational amplifier will degrade the accuracy of the cancellation. Third, it can at best alleviate the UP/DN current mismatch but still cannot solve the aforementioned problem of the noises induced due to the switching activities of switches.

What is needed is a low-complexity method to remove the UP/DN current mismatch and also alleviate the problem of the noises induced due to the switching activities.

BRIEF SUMMARY OF THIS INVENTION

In an embodiment, a charge pump circuit is disclosed, the circuit comprising: a current source enabled by a first logical signal, a current sink enabled by a second logical signal, an integrating capacitor coupled to the current source and also to the current sink, and a switching device coupled between the integrating capacitor and an output node, wherein the switching device has two states controlled at least by the first logical signal and the second logical signal and a third logical signal.

In an embodiment, a method of constructing a charge pump circuit is disclosed, the method comprising: receiving a first logical signal and a second logical signal and operating the charge pump circuit through an integrating phase and a charge sharing phase, where each phase is defined at least by a state of the first logical signal, wherein: during the integrating phase perform a charge injection to an integrating capacitor or a charge draining from the integrating capacitor depending on at least a state of the first logical signal; and during the charge sharing phase conditionally connect the integrating capacitor to a load device to allow the charge stored on the integrating capacitor to share with the load depending on at least a state of the second logical signal.

In a further embodiment, a method of constructing a charge pump circuit is disclosed, the method comprising: receiving a first logical signal, a second logical signal, and a third logical signal; generating a modulating signal; performing a charge injection to an integrating capacitor whenever the first logical signal is asserted; performing a charge draining from the integrating capacitor whenever the second logical signal is asserted; and conditionally connecting the integrating capacitor to a load device to allow the charge stored on the integrating capacitor to share with the load, depending on a logical operation on the first logical signal, the second logical signal, the third logical signal, and the modulating signal.

BRIEF DESCRIPTION OF THE DRAWINGS

Other objects, features, and advantages of the present invention will become more apparent from the following detailed description when read in conjunction with the accompanying drawings, in which.

DETAILED DESCRIPTION OF THIS INVENTION

In the present disclosure, numerous specific details are provided, such as examples of apparatus, circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
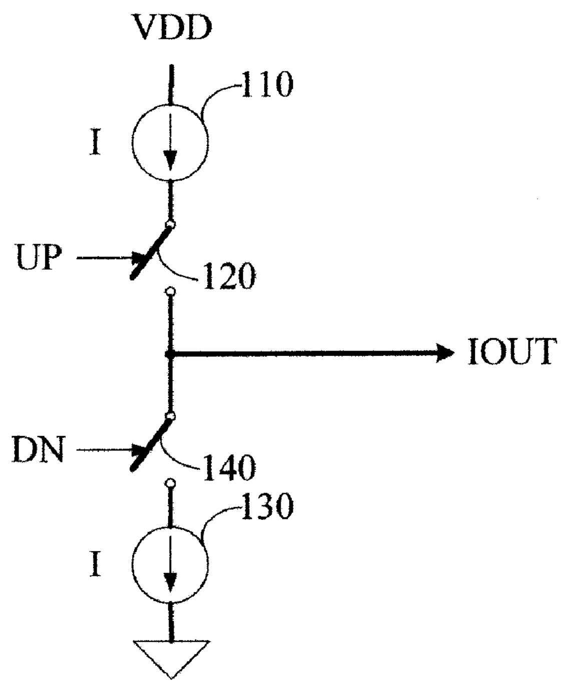
FIG. 1 depicts a prior art charge pump circuit.
Figure 2:
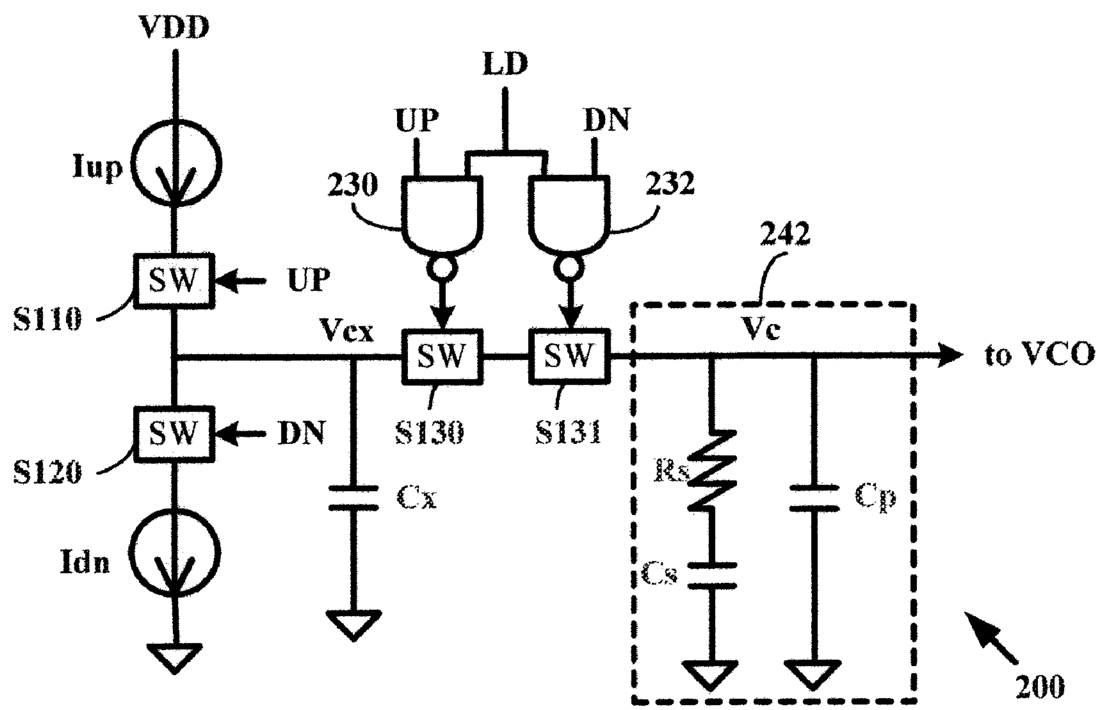
FIG. 2 depicts an embodiment of a CP-LF (charge pump-loop filter) circuit in an embodiment of the present invention.

FIG. 2 depicts a schematic diagram of an embodiment of CP-LP (charge pump-loop filter) circuit 200 in accordance with the present invention. Here, CP-LP circuit 200 comprises a current source Iup, a current sink Idn, and a first capacitor Cx. Iup is coupled to Cx through a first switch S110 controlled by the UP signal, while Idn is coupled to Cx through a second switch S120 controlled by the DN signal. CP-LP circuit 200 further comprises a loop filter 242. By way of example but not limitation, loop filter 242 comprises a second capacitor Cp in parallel connection with a RC circuit. Those of ordinary skill in the art may include additional components into the loop filter 242, e.g. an additional RC circuit, to provide more filtering.

Still refer to FIG. 2. The output of the charge pump circuit, annotated by the node voltage Vcx, is coupled to loop filter 242 via a switch module. In an embodiment, the switch module includes a third switch S130 and a fourth switch S131. The third switch S130 is controlled by a logical signal obtained from a logical NAND 230 operation on UP and a control signal LD; while the fourth switch S140 is controlled by a logical signal obtained from a logical NAND 232 operation on DN and LD. The control signal LD, which stands for "lock detected," is generated from a lock detector circuit (not shown in FIG. 2), which asserts LD when it detects the PLL, within which the CP-LP circuit 200 is employed, has settled into a locked-in state. The design of a lock detector circuit is well known in prior art and is thus not described here. In an alternative embodiment, the control signal LD is generated by a timer circuit, which asserts LD after a predefined period of time following a reset to the PLL.

When the LD signal is not asserted, both S130 and S140 are closed and the CP-LP circuit 200 becomes effectively the same as a prior art CP-LP circuit. This happens for a period of time following a reset to the PLL. After the LD signal is asserted (by a lock detector circuit, a timer, or other means), S130 will be effectively controlled by the logical inversion of UP, while S140 will be effectively controlled by the logical inversion of DN.

Figure 3:
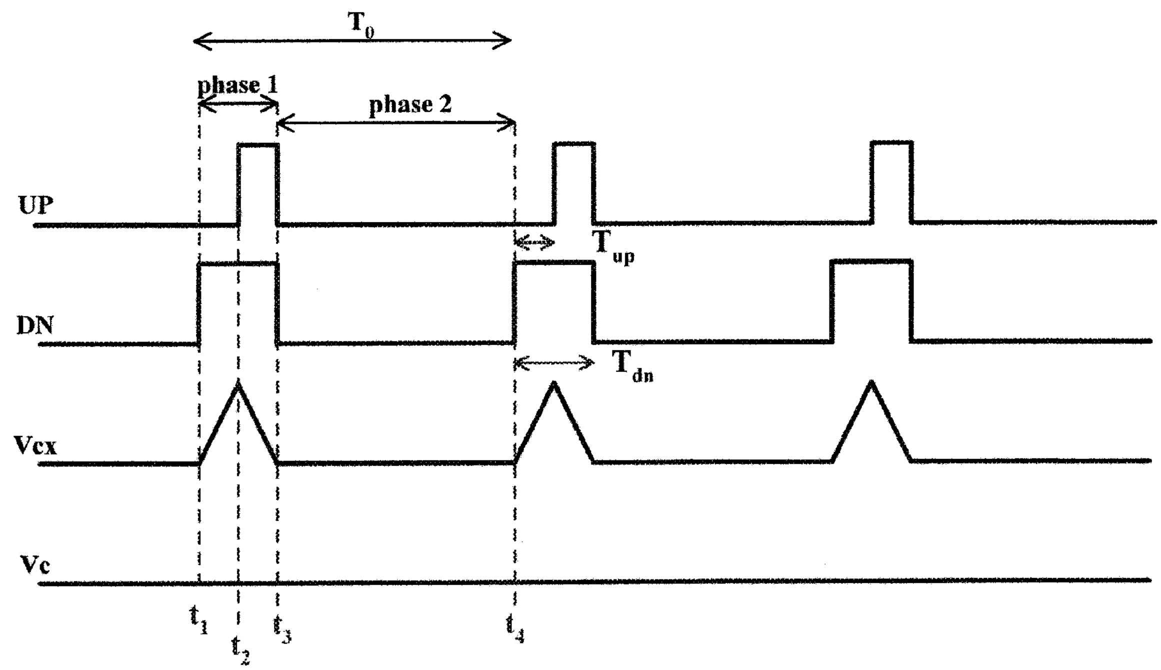
FIG. 3 depicts an illustrative timing diagram for the CP-LF circuit of FIG. 2.

An illustrative timing diagram of the CP-LP circuit 200, during a steady state where LD is asserted, is shown in FIG. 3. By way of example without loss of generality, the magnitude of the current source Iup is about twice as large as that of the current sink Idn. As shown in FIG. 3, the time duration where either UP or DN is asserted is referred to as phase 1. The time duration after both UP and DN are de-asserted and before either UP or DN is asserted again is referred to as phase 2. During phase 1, either S130 or S131 is opened (since either UP or DN is asserted), and the charge pump circuit injects or drains charge to Vcx. During phase 2, both S130 and S131 are closed (since both UP and DN are de-asserted), and the newly injected or drained charge during phase 1 needs to be shared by the capacitor Cx with the loop filter 242. In the steady state, there should be zero net charge delivered to Cx during phase 1 (otherwise the output voltage of the CP-LP circuit 200 will still be drifting and thus the PLL will still be in a transient state). Therefore, a DN pulse will be about twice as wide as that of an accompanying UP pulse (so that the net charge injected from the current source Iup will be evenly offset by the net charge drained from the current sink Idn). As shown in FIG. 3, a DN pulse starts at $t_1$ and ends at $t_3$, while an accompanying UP pulse starts at $t_2$ and ends at $t_3$. The voltage Vcx first increases linearly after $t_1$ due to the charge injection from current source Iup, but then decreases linearly after $t_2$ due to the charge injection from current source Iup. At the time instant $t_3$, where both the UP pulse and the DN pulse end, the net charge injected by Iup must be evenly offset by the net charge drained by Idn. As a result, the voltage Vcx at time $t_1$ will be exactly the same as that at time $t_3$. Since there is zero net charge picked up by Cx during phase 1, there is nothing to share during phase 2; therefore the output voltage Vc remains constant. The prior art problem of voltage ripple is thus resolved.

Note that the waveforms in FIG. 3 repeat at a period of $T_0$, the period of the reference clock.

Figure 4:
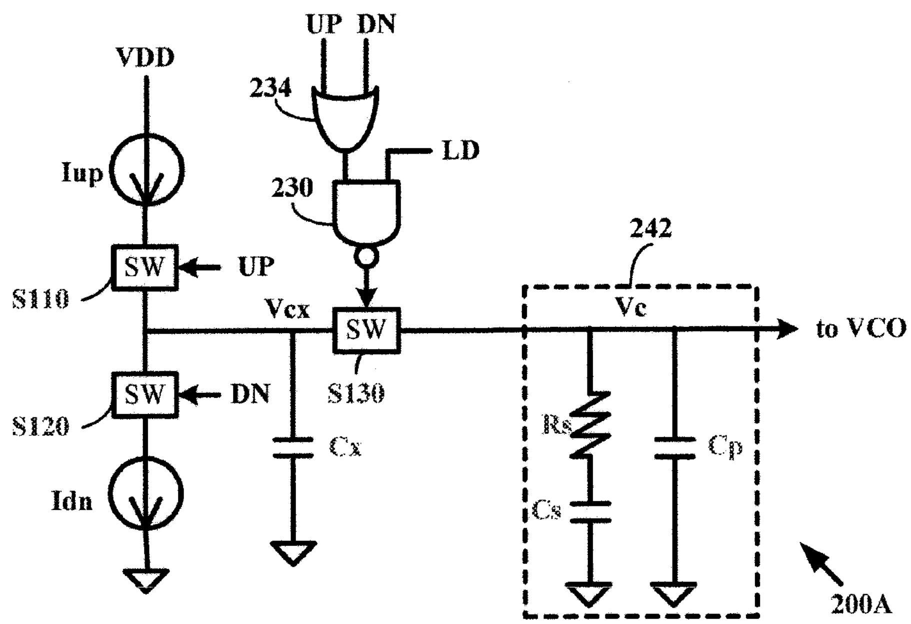
FIG. 4 depicts an alternative embodiment of the present invention.

Those of ordinary skill in the art can construct numerous alternative forms to practice the principle disclosed by the present invention. For example, an alternative embodiment of CP-LP circuit 200A is depicted in FIG. 4. Here, we remove switch S131 and NAND gate 232 and introduce a logical OR 234 operation. This effectively accomplishes the same result as that of CP-LP circuit 200.

The principle disclosed thus far successfully solves the problem of UP/DN current mismatch, with a very low circuit complexity. The aforementioned problem of induced noises due to switching activities, however, is still present.

Figure 5:
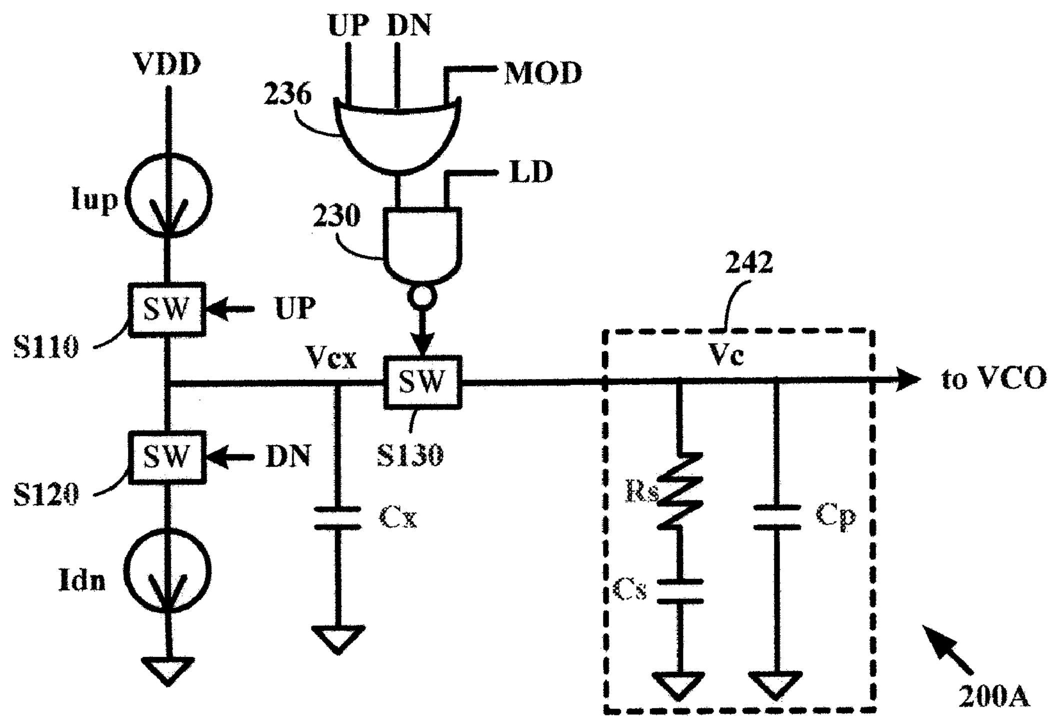
FIG. 5 depicts a further embodiment of the present invention.

A further embodiment aimed to solve the problem of induced noise due to switching activities is shown in FIG. 5. Here, we replace the OR 234 operation of FIG. 4 with an OR 236 operation, which receives UP, DN, and a modulating signal MOD as an input. The modulating signal MOD is substantially different the reference clock. The switch S130 is closed during phase 2 only when the modulating signal MOD is asserted. The induced noise due to switching activities is thus modulated by the modulating signal MOD. Since the modulating signal MOD is substantially different from the reference clock, the aforementioned spurious spectral component at the reference frequency is thus highly suppressed (and theoretically totally removed) due to the modulation. In an embodiment, the modulating signal MOD is a pseudo-random (PN) sequence; and this effectively whitens the induced noise. The method for generating a PN sequence is well known in prior art, e.g. using a linear feedback shift register, and thus not described here. In an alternative embodiment, the modulating signal MOD is a periodic signal of a fundamental frequency much higher than that of the reference clock; and this effectively translates the dominant spectral component of the induced noise into a high frequency, which can easily be filtered out by the loop filter.

Figure 6:
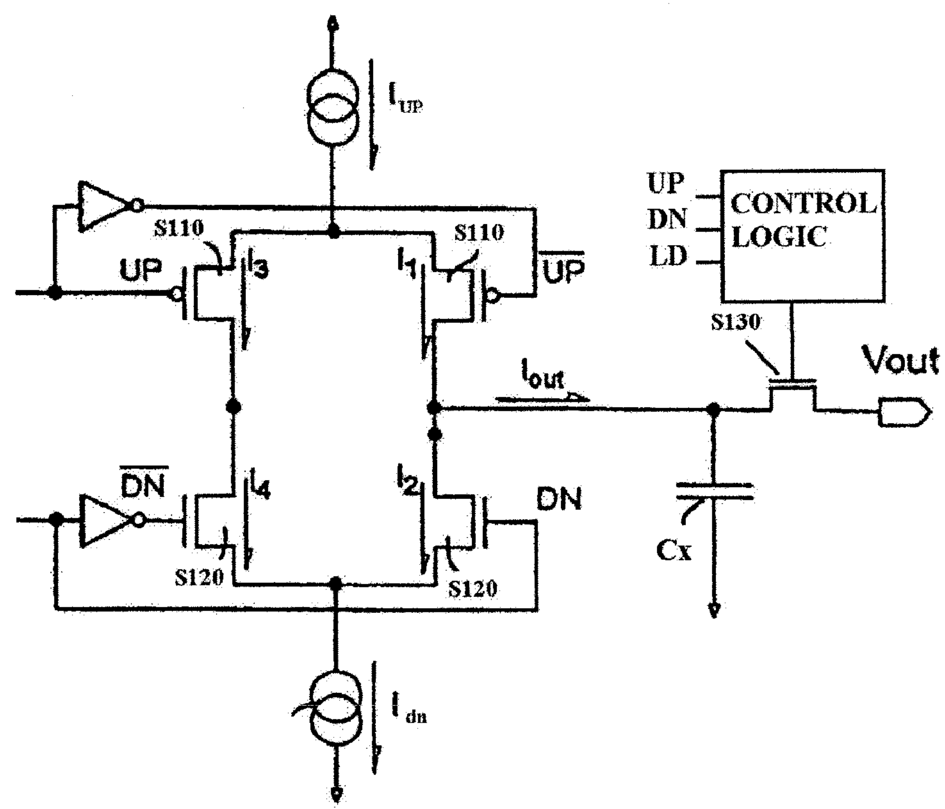
FIG. 6 depicts a further embodiment of the charge pump according to the present invention.

A further embodiment is shown in FIG. 6. FIG. 6 depicts a further embodiment of the charge pump according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump circuit comprising:

a current source enabled by a first logical signal;

a current sink enabled by a second logical signal;

a capacitor coupled to the current source and to the current sink; and a switching device, coupled between the capacitor and an output node of the charge pump circuit, to receive the first logical signal, the second logical signal, and a third logical signal, wherein the operation of the switching device is corresponding to the first logical signal, the second logical signal, and the third logical signal.

2. The circuit of claim 1, wherein the switching device is disconnected when at least one of the current source and the current sink is enabled.

3. The circuit of claim 1, wherein the charge pump circuit is used in a clock signal generator, the third logical signal is corresponding to a locked status of the clock signal generator.

4. The circuit of claim 1, wherein the switching device receives a fourth logical signal, the switching device is controlled by a fourth logical signal.

5. The circuit of claim 4, wherein the fourth logical signal is a pseudo-random signal.

6. The circuit of claim 4, wherein the fourth logical signal is a periodic signal.

7. The circuit of claim 6, wherein a frequency of the fourth logical signal is higher than that of the first logical signal.

8. A clock signal generator comprising:

a detector to detect a difference of a phase or frequency of a first signal and a reference signal and thereby output a first and a second logical signal;

a charge pump to receive the first and the second logical signals and output a control signal; and a circuit to generate the reference signal according to the control signal;

wherein the charge pump comprises:

a first current source enabled by the first logical signal;

a second current source enabled by the second logical signal;

a capacitor coupled to the current source and to the current sink; and a control logic for receiving the first and the second logical signals and a third logical signal, and output a control signal depending on a logical operation on the first and the second logical signals and the third logical signal; and a switching circuit, coupled between the capacitor and an output node of the charge pump circuit, wherein the switching device is controlled by the control signal of the control logic.

9. The generator of claim 8, wherein the control logic comprises:

a locked detector to determine whether the clock signal generator is in a locked status and output the third logical signal.

10. The generator of claim 9, wherein the control logic comprises a pseudo-random generator for generating a pseudo-random signal, wherein the control signal is corresponding to the pseudo-random signal.

11. The generator of claim 8, wherein the control logic comprises a pseudo-random generator for generating a pseudo-random signal, wherein the third logical signal comprises the pseudo-random signal.

12. The generator of claim 8, wherein a frequency of the third logical signal is higher than that of the first logical signal.

13. A method used in a charge pump of a signal generator, the method comprising:

enabling a current source by a first logical signal to charge a capacitor;

enabling a current sink by a second logical signal to discharge the capacitor;

receiving a third logical signal; and determining whether an output of the charge pump is transferred to a load device depending on a logical operation on the first logical signal, the second logical signal, and the third logical signal.

14. The method of claim 13, further comprising:

stopping transferring the output of the charge pump when at least one of the current source and the current sink is enabled.

15. The method of claim 13, further comprising:

determining whether the signal generator is in a locked status and thereby outputting a locked signal, wherein the third logical signal comprises the locked signal.

16. The method of claim 15, wherein the third logical comprises a pseudo-random signal.

17. The method of claim 15, wherein the third logical comprises a periodic signal, and a frequency of the periodic logical signal is higher than that of the first logical signal.

18. The method of claim 13, wherein the third logical comprises a pseudo-random signal.

19. The method of claim 13, wherein a frequency of the third logical signal is higher than that of the first logical signal.

20. A method used in a charge pump of a signal generator, the method comprising:

performing a charge injection to a capacitor whenever a first logical signal is asserted;

performing a charge draining from the capacitor whenever a second logical signal is asserted;

detecting a locked status of the signal generator and thereby output a third logical signal; and conditionally allowing the charge stored on the capacitor to share with a load depending on a logical operation on the first logical signal, the second logical signal, and the third logical signal.

21. The method of claim 20, further comprising:

stopping sharing the charge stored on the capacitor to the load when at least one of the first logical signal and the second logical signal is asserted.

22. The method of claim 20, further comprising:

receiving a fourth logical signal; and conditionally allowing the charge stored on the capacitor to share with the load depending on a logical operation on the first, the second, the third and the fourth logical signals such that an induced noise of the signal generator is reduced.

* * * * *